United States Patent
Maury et al.

(10) Patent No.: US 10,234,697 B2
(45) Date of Patent: Mar. 19, 2019

(54) COMPOSITE HIGH INDEX LAYERS FOR ANTI REFLECTIVE STACKS

(71) Applicant: Essilor International, Charenton-le-Pont (FR)

(72) Inventors: Hélène Maury, Paris (FR); Xingzhao Ding, Singapore (SG)

(73) Assignee: ESSILOR INTERNATIONAL, Charenton-le-Pont (FR)

( * ) Notice: Subject to any disclaimer, the term of this patent is extended or adjusted under 35 U.S.C. 154(b) by 4 days.

(21) Appl. No.: 15/381,865

(22) Filed: Dec. 16, 2016

(65) Prior Publication Data

US 2017/0299887 A1   Oct. 19, 2017

(30) Foreign Application Priority Data

Dec. 18, 2015   (EP) .................................... 15307049

(51) Int. Cl.
| | |
|---|---|
| *G02C 7/02* | (2006.01) |
| *C23C 14/46* | (2006.01) |
| *C23C 14/34* | (2006.01) |
| *C23C 16/513* | (2006.01) |
| *C23C 14/24* | (2006.01) |
| *G02B 1/115* | (2015.01) |
| *G02B 5/28* | (2006.01) |

(52) U.S. Cl.
CPC .............. *G02C 7/022* (2013.01); *C23C 14/24* (2013.01); *C23C 14/3407* (2013.01); *C23C 14/46* (2013.01); *C23C 16/513* (2013.01); *G02B 1/115* (2013.01); *G02B 5/283* (2013.01); *G02C 7/02* (2013.01); *C03C 2217/734* (2013.01)

(58) Field of Classification Search
CPC ..... G02C 7/022; C23C 14/24; C23C 14/3407; C23C 14/46; C23C 16/513
USPC .......................................................... 351/44
See application file for complete search history.

(56) References Cited

U.S. PATENT DOCUMENTS

| | | | |
|---|---|---|---|
| 4,260,222 A | 4/1981 | Kozawa | |
| 2008/0002260 A1* | 1/2008 | Arrouy | G02B 1/115 359/586 |
| 2011/0229660 A1* | 9/2011 | Reynolds | C23C 14/08 427/595 |
| 2015/0241602 A1 | 8/2015 | Avetisian et al. | |

FOREIGN PATENT DOCUMENTS

| | | |
|---|---|---|
| EP | 1211524 | 6/2002 |
| EP | 2685293 | 1/2014 |
| WO | WO2015/000534 | 1/2015 |

OTHER PUBLICATIONS

Citek et al., "Anti-reflective Coatings Reflect Ultraviolet Radiation", Journal of the American Optometric Association, vol. 79, No. 3, (2008), pp. 143-148.

* cited by examiner

*Primary Examiner* — William R Alexander
*Assistant Examiner* — Grant A Gagnon
(74) *Attorney, Agent, or Firm* — Norton Rose Fulbright US LLP (57) ABSTRACT

An ophthalmic lens comprising an antireflective stack which strongly reduces reflection in the UV range and in the visible range. The antireflective stack comprises composite high index layers comprising zirconium oxide and another metal oxide.

14 Claims, 5 Drawing Sheets

COMPOSITE HIGH INDEX LAYERS FOR ANTI REFLECTIVE STACKS

BACKGROUND

The present invention relates to an ophthalmic lens comprising an antireflective stack which strongly reduces reflection in the UV range and in the visible range. The antireflective stack comprises composite high index layers.

In the past few years, anti-UV function has been greatly emphasized due to the increasing concern on eye protection against ultra violet (UV) light. In particular, UV light coming from back or side of wearer should not be reflected towards wearer's eyes by the rear face of ophthalmic lenses. A very efficient antireflective property in the ultraviolet light range is required. This property is easily measured by Ruv, the mean reflection factor between 280 nm and 380 nm, weighted by the function $W(\lambda)$ defined in the ISO 13666: 1998 standard. In the same time, a very efficient antireflective property in the visible range is required for the front face of the lens to avoid ghosts and cosmetically unpleasant reflected light. This property is easily measured by Rv, the mean reflection factor as defined in the ISO 13666:1998 standard.

Unfortunately, when a stack is designed to minimize Ruv, Rv is usually too high. And when a stack is designed with a very low Rv, Ruv is usually not satisfying. The balance between Ruv and Rv should be improved.

Inventors surprisingly discovered that using composite high index layers enables design of very efficient antireflective stack simultaneously for Ruv and Rv.

Composite layers have been already used in antireflective stacks for various industries. U.S. Pat. No. 4,260,222 discloses three layered antireflective stacks in which a single composite layer of zirconium oxide and tantalum oxide is used. This composite layer is deposited in high temperature conditions, which are not suitable for organic ophthalmic lenses, and its composition provides a better uniformity of refractive index. However, antireflective performance in UV range is not considered, and is actually bad.

European patent EP1211524 discloses four layered antireflective stacks for ophthalmic lenses in which high index layers are composite layers of Titanium oxide, Niobium oxide and zirconium oxide, providing improved mechanical and chemical characteristics to the antireflective stack. niobium oxide and titanium oxide are required as main components, in amount larger than 25% for niobium oxide. Actually, performance in UV range is not demonstrated.

SUMMARY

A first object of the invention is an ophthalmic lens comprising a substrate with a main face, said main face being coated with an antireflective stack comprising at least one composite layer comprising zirconium oxide and another metal oxide, characterized in that the mean reflection factor Ruv on said main face, between 280 nm and 380 nm, weighted by the function $W(\lambda)$ defined in the ISO 13666:1998 standard, is lower than 7%, for an angle of incidence comprised in the range 30°-45°.

A second object of the invention is a method to prepare an ophthalmic lens comprising a substrate with a main face, said main face being coated with an antireflective stack comprising at least one composite layer comprising zirconium oxide and another metal oxide, characterized in that the mean reflection factor Ruv on said main face, between 280 nm and 380 nm, weighted by the function $W(\lambda)$ defined in the ISO 13666:1998 standard, is lower than 7%, for an angle of incidence comprised in the range 30°-45°; characterized in that zirconium oxide and another metal oxide are simultaneously evaporated in a vacuum deposition step.

DETAILED DESCRIPTION

Ophthalmic lens according to the invention comprises a substrate and an antireflective stack.

Any substrate known in the ophthalmic industry is suitable for the invention, especially organic lens substrates, for example a thermoplastic or thermosetting plastic material.

Thermoplastic may be selected from, for instance: polyamides; polyimide; polysulfones; polycarbonates and copolymers thereof; poly(ethylene terephtalate) and polymethylmethacrylate (PMMA).

Thermoset materials may be selected from, for instance: cycloolefin copolymers such as ethylene/norbornene or ethylene/cyclopentadiene copolymers; homo- and copolymers of allyl carbonates of linear or branched aliphatic or aromatic polyols, such as homopolymers of diethylene glycol bis(allyl carbonate) (CR 39®) ; homo- and copolymers of (meth)acrylic acid and esters thereof, which may be derived from bisphenol A; polymer and copolymer of thio(meth) acrylic acid and esters thereof, polymer and copolymer of allyl esters which may be derived from Bisphenol A or phtalic acids and allyl aromatics such as styrene, polymer and copolymer of urethane and thiourethane, polymer and copolymer of epoxy, and polymer and copolymer of sulphide, disulfide and episulfide, and combinations thereof.

As used herein, a (co)polymer is intended to mean a copolymer or a polymer. As used herein, a (meth)acrylate is intended to mean an acrylate or a methacrylate. As used herein, a polycarbonate (PC) is intended to mean either homopolycarbonates or copolycarbonates and block copolycarbonates.

The antireflective coating may be deposited directly onto a bare substrate. In some applications, it is preferred for the front and/or rear main face of the substrate to be coated with one or more functional coatings prior to depositing the antireflective coating. These functional coatings traditionally used in optics may be, without limitation, an impact-resistant primer layer, an abrasion-resistant coating and/or a scratch-resistant coating, a polarizing coating, a photochromic coating or a tinted coating.

Generally, the front and/or rear main face of the substrate onto which an antireflective coating will be deposited is coated with an impact-resistant primer layer, with an anti-abrasion and/or anti-scratch coating, or with an impact-resistant primer layer coated with an anti-abrasion and/or anti-scratch coating.

Prior to depositing the abrasion-resistant coating and/or the scratch-resistant coating, it is possible to apply onto the substrate a primer coating to improve the impact resistance and/or the adhesion of the subsequent layers in the final product. This coating may be any impact-resistant primer layer traditionally used for articles in a transparent polymer material, such as ophthalmic lenses.

In the following, "substrate" is intended to mean a coated or uncoated substrate.

The substrate may also be pre-treated with a physical or chemical surface activating treatment, so as to reinforce the adhesion of the antireflective coating on the substrate. Such pre-treatment is generally conducted under vacuum. It may be a bombardment with energetic and/or reactive species, for example with an ion beam ("Ion Pre-Cleaning" or "IPC") or with an electron beam, a corona discharge treatment, an ion spallation treatment, an ultraviolet treatment or a plasma-mediated treatment under vacuum, generally using an oxygen or an argon plasma. It may also be an acid or basic treatment and/or a solvent-based treatment (water, hydrogen peroxide or any organic solvent).

An antireflection coating, or stack, usually consists of a multilayer comprising interferential thin layers, generally an alternation of layers based on a dielectric material of high refractive index (HI) and a dielectric material of low refractive index (LI). When deposited on a transparent substrate, the function of such a coating is to reduce its light reflection and therefore to increase its light transmission.

Said antireflection stack may be deposited on the front main face of the substrate or on the rear main face of the substrate or on both main faces. So as to avoid reflection of light coming from back or side of wearer, the antireflection stack is preferably deposited on rear main face.

In the present invention, a layer of the antireflective coating is said to be a layer with a high refractive index (HI) when its refractive index is higher than or equal to 1.55, preferably higher than or equal to 1.6, even more preferably higher than or equal to 1.7, even more preferably higher than or equal to 1.8 and most preferably higher than or equal to 1.9.

In the present invention, a layer of an antireflective coating is said to be a low refractive index layer (LI) when its refractive index is lower than 1.55, preferably lower than or equal to 1.50, more preferably lower than or equal to 1.48. Said LI layer preferably has a refractive index higher than 1.1.

Unless otherwise specified, the refractive indexes referred to in the present application are expressed at 25° C. at a wavelength of 550 nm.

The antireflection stack of the invention comprises at least one composite layer comprising zirconium oxide and another metal oxide.

In some embodiments, the antireflection stack of the invention comprises at least two composite layers comprising zirconium oxide and another metal oxide.

In some embodiments, said composite layer has a refractive index higher than 1.6, preferably higher than 1.7, more preferably higher than 1.8, ideally higher than 1.9. With composite layers of refractive index higher than 1.9, Rv/Ruv compromise is improved.

Suitable metal oxide in composite layer are, besides zirconium oxide ($ZrO_2$) and without limitations, titanium dioxide ($TiO_2$), alumina ($Al_2O_3$), tantalum pentoxide ($Ta_2O_5$), neodymium oxide ($Nd_2O_5$), praseodymium oxide ($Pr_2O_3$), praseodymium titanate ($PrTiO_3$), lanthanum oxide ($La_2O_3$), niobium oxide ($Nb_2O_5$), yttrium oxide ($Y_2O_3$). Optionally, the composite layer may further contain silica or other materials with a low refractive index, provided the composite layer has a refractive index higher than or equal to 1.55.

For all metal oxides, the composition is intended to encompass a range of compositions around the exact stoichiometric value, plus or minus 5%. For instance, $ZrO_2$ encompasses all metal oxides with composition $ZrO_x$, $1.9 < x < 2.1$.

As titanium oxide ($TiO_2$) and yttrium oxide ($Y_2O_3$) are slightly dispersive in UV-violet light domain, these metal oxides are less preferred. Specific embodiments of the invention do not contain any of these metal oxides.

The preferred metal oxides include tantalum pentoxide ($Ta_2O_5$) and niobium oxide ($Nb_2O_5$).

The LI layer may comprise, without limitation, $SiO_2$, or a mixture of silica and alumina, especially silica doped with alumina, the latter contributing to increase the antireflective coating thermal resistance. The LI layer is preferably a layer comprising at least 80% by weight of silica, more preferably at least 90% by weight of silica, relative to the layer total weight, and even more preferably consists in a silica layer.

Optionally, the LI layers may further contain materials with a high refractive index, provided the refractive index of the resulting layer is lower than 1.55.

In the invention, the antireflective coating total thickness is lower than 1 micrometer, preferably lower than or equal to 800 nm, more preferably lower than or equal to 500 nm and even more preferably lower than or equal to 250 nm. The antireflective coating total thickness is generally higher than 100 nm, preferably higher than 150 nm.

In some embodiments of the present invention, the antireflective coating is deposited onto a sub-layer. It should be noted that such antireflective coating sub-layer does not belong to the antireflective coating.

As used herein, an antireflective coating sub-layer or adhesion layer is intended to mean a relatively thick coating, used in order to improve the mechanical properties such as the abrasion resistance and/or the scratch resistance of said coating and/or so as to reinforce its adhesion to the substrate or to the underlying substrate.

Because of its relatively high thickness, the sub-layer does not generally take part to the antireflective optical activity, especially when it has a refractive index close to that of the underlying substrate.

The sub-layer should have a thickness that is sufficient for promoting the abrasion resistance of the antireflective coating, but preferably not to such an extent that a light absorption could be caused, which, depending on the sub-layer nature, could significantly reduce the relative transmission factor Tv. Its thickness is generally lower than 500 nm, preferably lower than 300 nm, more preferably lower than 200 nm, and is generally higher than 90 nm, more preferably higher than 100 nm.

The sub-layer preferably comprises a SiO2-based layer, this layer comprising preferably at least 80% by weight of silica, more preferably at least 90% by weight of silica, relative to the layer total weight.

In another embodiment, this SiO2-based layer is a silica layer doped with alumina, in amounts such as defined hereabove, preferably consists in a silica layer doped with alumina.

In a particular embodiment, the sub-layer consists in a SiO2 layer.

The various layers of the antireflective coating and the optional sub-layer are preferably deposited by physical vapor deposition, under vacuum, according to any of the following methods:

i) by optionally ion-beam assisted, evaporation;
ii) by ion-beam sputtering;
iii) by cathode sputtering;
iv) by plasma-assisted chemical vapor deposition.

These various methods are described in the following references "Thin Film Processes" and "Thin Film Processes II," Vossen & Kern, Ed., Academic Press, 1978 and 1991, respectively. A particularly recommended method is the evaporation under vacuum. Preferably, the deposition of each of the layers of the antireflective coating and of the optional sub-layer is conducted by evaporation under vacuum.

Especially, the composite layer of the invention may be deposited by simultaneous evaporation from two distinct sources of pure ZrO2 in one crucible and pure other metal oxide in a second crucible; and control of evaporation rates from each crucible to obtain the weight composition of the composite layer. Alternatively, the composite layer may be deposited from evaporation of a single composite source. This composite source is typically obtained by mixing powder of ZrO2 and powder of metal oxide in weight proportions expected for composite layer composition.

The ophthalmic lens of the invention may be made antistatic, that is to say not to retain and/or develop a substantial static charge, by incorporating at least one charge dissipating conductive layer into the antireflective coating present on the surface of the article.

The ophthalmic lens according to the invention may also comprise coatings formed on the antireflective coating and capable of modifying the surface properties thereof, such as hydrophobic and/or oleophobic coatings (antifouling top coat). These coatings are preferably deposited onto the outer layer of the antireflective coating.

Typically, an ophthalmic lens according to the invention comprises a substrate that is coated on at least on face with an impact-resistant primer layer, an anti-abrasion and scratch-resistant layer, an antireflective coating according to the invention, and with a hydrophobic and/or oleophobic coating, or with a hydrophilic coating which provides antifog properties, or an antifog precursor coating.

The ophthalmic lens according to the invention is preferably an ophthalmic lens for spectacles (spectacle lens), or a blank for ophthalmic lenses.

As stated above, the function of an antireflective coating is to reduce light reflection and therefore to increase light transmission through the substrate on which it has been laid. These optical characteristics are measured with colorimetric coefficients and reflection factors, for several angles of incidence.

The "angle of incidence" is the angle formed by a ray light incident on an ophthalmic lens surface and a normal to the surface at the point of incidence. The ray light is for instance an illuminant light source, such as the standard illuminant D65 as defined in the international colorimetric CIE L*a*b*. Generally the angle of incidence changes from 0° (normal incidence) to 90° (grazing incidence). The usual range for angle of incidence is from 0° to 75°.

The colorimetric coefficients of the ophthalmic lens of the invention in the international colorimetric system CIE L*a*b* are calculated between 380 and 780 nm, taking the standard illuminant D 65 and the observer into account (angle of 10°). It is possible to prepare antireflective coatings, without limitation as regards their hue angle. The observer is a "standard observer" as defined in the international colorimetric system CIE L*a*b*.

For aesthetic reasons, hue of the reflected light, for an angle of incidence comprised in the range 0°-20°, is preferably green (120°<hue<150°), gold (30°<hue<60°), blue (240°<hue<280°) or violet/purple (300°<hue<340°). The desired chroma of the reflected light, for an angle of incidence comprised in the range 0°-20°, is lower than 15, preferably lower than 12. A chroma of 9 is generally considered as good for aesthetic reasons.

The "mean light reflection factor", noted Rv, is such as defined in the ISO 13666:1998 Standard, and measured in accordance with the ISO 8980-4, i.e. this is the weighted spectral reflection average over the whole visible spectrum between 380 and 780 nm. Rv is usually measured for an angle of incidence lower than 17°, typically of 15°, but can be evaluated for any angle of incidence.

The mean reflection factor between 280 nm and 380 nm, weighted by the W($\lambda$) function defined according to the ISO 13666:1998 Standard and noted Ruv, may be defined through the following relation:

$$R_{UV} = \frac{\int_{280}^{380} W(\lambda) \cdot R(\lambda) \cdot d\lambda}{\int_{280}^{380} W(\lambda) \cdot d\lambda}$$

wherein R($\lambda$) represents the lens spectral reflection factor at a given wavelength, and W($\lambda$) represents a weighting function equal to the product of the solar spectrum irradiance Es($\lambda$) and the efficiency relative spectral function S($\lambda$).

The mean reflection factor between 280 nm and 380 nm Ruv on main face of ophthalmic lens of the invention is lower than 7%, preferably lower than 5%, more preferably lower than 4%, even more preferably lower than 3%, ideally lower than 2% for an angle of incidence comprised in the range 30°-45°, preferably for an angle of incidence of 35°.

The mean light reflection factor Rv on main face of ophthalmic lens of the invention is preferably lower than 1.25%, for an angle of incidence comprised in the range 0°-20°.

An antireflective coating, depending on its structure (nature of metal oxides, number and thickness of layers) and on the refractive index of the substrate, will present specific colorimetric and reflection characteristics. Obtaining a balance of all properties is the art of antireflective coating design.

In particular, Rv and Ruv reflection factors are correlated, and it's not possible to minimize simultaneously Rv and Ruv as one would desire.

EXAMPLES

In all following examples, antireflective stacks are four layered stacks comprising alternating low refractive index material and high refractive index material. Low refractive index material is always pure SiO2. In comparative examples, high refractive index material is a pure mineral oxide, actually ZrO2, Ta2O5 or Nb2O5. In inventive examples, high refractive index material is a composite comprising ZrO2, actually composite of ZrO2 and Ta2O5 or composite of ZrO2 and Nb2O5.

The exact composition of the antireflective stack is represented by the following formula:

High refractive index material/SiO2

In which high refractive index material composition is represented by

N % Oxide1-(100-N) % Oxide2

For instance, the following antireflective stack: 90% ZrO2-10% Ta2O5/SiO2 represents a four layered stack comprising, in the direction moving away from substrate, one layer of composite comprising 90% ZrO2 and 10% Ta2O5, one layer of SiO2, one layer of composite comprising 90% ZrO2 and 10% Ta2O5 and last, one layer of SiO2.

For comparative examples, N=100 and Oxide1 is either ZrO2 or Ta2O5 or Nb2O5.

In all following examples, Rv is evaluated for an angle of incidence of 15° and Ruv is evaluated for an angle of incidence of 35°. Chroma is always set to 9. Reflected light is either green (hue=135°) or gold (hue=45°). Refractive index of substrate is either 1.5 or 1.6. Calculations are performed with standard software, such as MacLeod version 10, available from Thin Film Center.

Comparative Examples

Figure 1:
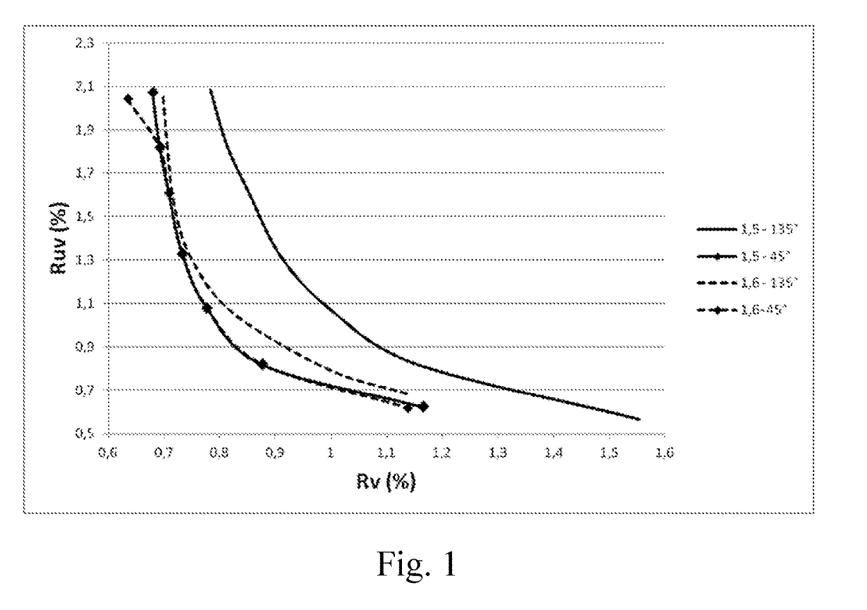
FIG. 1: Rv/Ruv compromise for SiO2/ZrO2 four layered stacks, on substrates of refractive index 1.5 (solid lines) or 1.6 (dotted lines), for a green reflected light (lines without marks) or gold reflected light (lines with diamonds).

FIG. 1 illustrates Rv/Ruv compromise, for four-layered antireflective stack comprising alternated zirconium oxide and silicon oxide (100% ZrO2/SiO2), on a substrate of given refractive index. This graph is plotted according to the following method. A specific Rv value is selected. Then antireflective coating structure (i.e. thicknesses of each metal oxide layers) is optimized to reach the lowest Ruv value, for a reflected light having a given hue (green or gold) and a low chroma.

From FIG. 1, one learns that antireflective coatings can not reach the domain below the curve, for the targeted colorimetric performances and substrate, using only pure zirconium oxide as high refractive index material and pure silicon oxide as low refractive index material.

Figure 2:
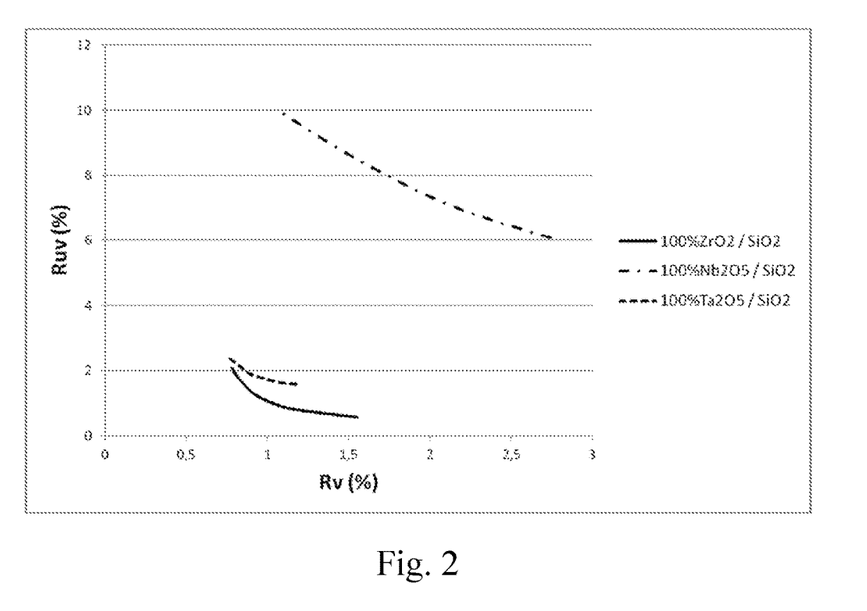
FIG. 2: Rv/Ruv compromise for four layered stacks with SiO2 as low refractive index material and ZrO2 (solid line), Nb2O5 (semi dotted line) and Ta2O5 (dotted line) as high refractive index material, on substrate of refractive index 1.5 and for a green reflected light.

FIG. 2 shows the Rv/Ruv compromise for four-layered antireflective stack, for three high refractive index materials, for green light reflected hue on substrate of refractive index 1.5. ZrO2 appears to be the best choice to reach simultaneously very low Rv and Ruv values. Ta2O5 is not as good as ZrO2, and Nb2O5 doesn't allow reaching Rv and Ruv values below 5%, which is a very poor performance.

Inventive Examples

Ophthalmic lenses according to the invention are described on FIG. 3 to FIG. 10.

Figure 3:
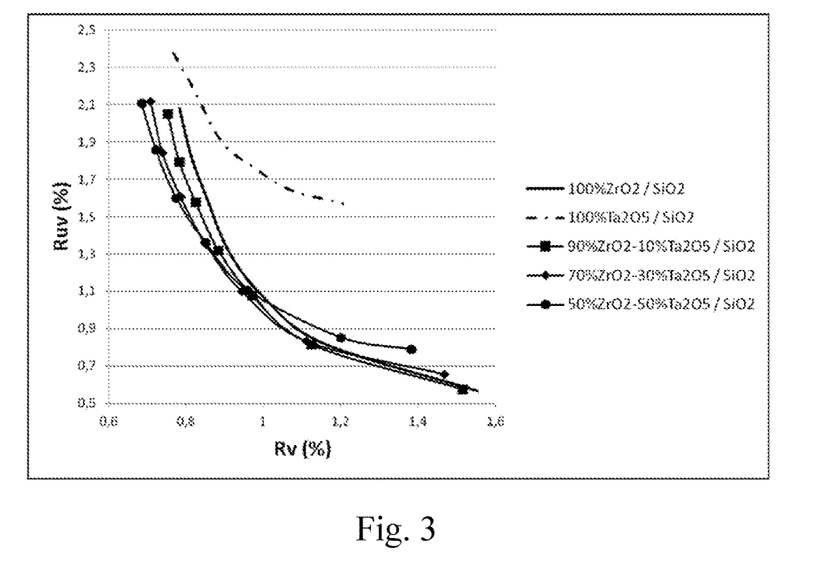
FIG. 3: Rv/Ruv compromise for composite layers of ZrO2/Ta2O5 of various compositions, on substrate of refractive index 1.5 and for a green reflected light.

FIG. 3 shows Rv/Ruv compromises for four layered stacks using a composite layer of ZrO2 and Ta2O5 as high refractive index material on substrate of refractive index 1.5 and for green reflected light. Surprisingly, the behavior of Rv/Ruv compromise curves for antireflective stacks with a composite layer is not an average curve located between Rv/Ruv compromises of four layered stacks using pure ZrO2 (solid line) or pure Ta2O5 (semi dotted line). Actually, using a composite as high refractive index material allows reaching simultaneously Rv and Ruv values lower than using a pure high refractive index material. For instance, with Ruv=1.5%, a stack using pure ZrO2 will have Rv=0.87% in the best conditions. With a composite comprising 10% Ta2O5 in weight, Rv=0.83% in the best conditions. With 30% or 50% Ta2O5 in weight, Rv may reach 0.80%. Such a variation is significant for antireflective properties.

More precisely, one can observe that the composites with high content of Ta2O5 (50%, curve with circles) are interesting for Rv values below 1%. Composites with lower content of Ta2O5 (10%, curve with squares) perform always better than pure ZrO2, but with smaller improvement.

Figure 4:
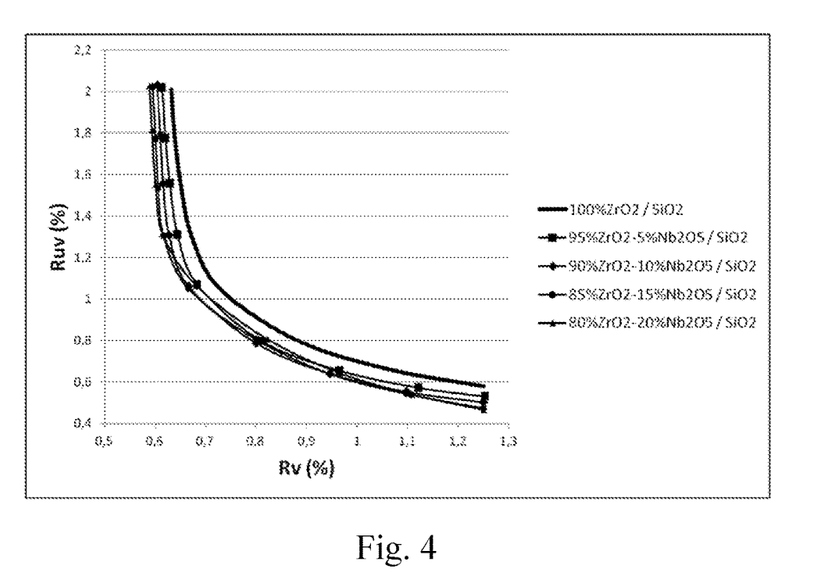
FIG. 4: Rv/Ruv compromise for composite layers of ZrO2/Nb2O5 of various compositions, on substrate of refractive index 1.6 and for a gold reflected light.

Similarly, FIG. 4 presents Rv/Ruv compromises for four layered antireflective stacks on a substrate of refractive index 1.6, according to the invention, using a composite layer of Nb2O5 and ZrO2 as high refractive index material and for gold reflected light. Again, Rv/Ruv compromise curves for antireflective stacks with a composite layer allow reaching lower Rv and Ruv values simultaneously, as compared to antireflective stacks with pure high refractive index material. Adding Nb2O5 high refractive index material brings a clear benefit to design antireflective stacks with simultaneously low Rv and Ruv values. With Ruv=1.2%, the use of composite layers allows lowering of Rv value of almost 0.1%, which is very significant for antireflective properties.

Similar results are presented in FIGS. 5 to 10, in which parameters of reflected light color (green, gold) and refractive index of substrate (1.5 and 1.6) are systematically varied.

In a specific embodiment of the invention, the composite layer or the composite layers when antireflection stack comprises at least two composite layers comprise less than 70% of Ta2O5 in weight, as compared to the total weight of the composite layer.

In another specific embodiment of the invention, the composite layer or the composite layers when antireflection stack comprises at least two composite layers comprise less than 23% of Nb2O5 in weight, as compared to the total weight of the composite layer. For composite comprising more than 25% of Nb2O5 in weight, performance is worse than for pure ZrO2 (data not shown).

In particular embodiments of the invention, the composite layer or the composite layers when antireflection stack comprises at least two composite layers comprise more than 30% of ZrO2 in weight, as compared to the total weight of the composite layer.

From FIGS. 3-10, one recognizes that Rv value lower than 1.25% is easily obtained, and that Ruv value lower than 2.5% is also easily obtained.

In some embodiments of the invention, mean light reflection factor Rv of main face of ophthalmic lens is lower than 1.25% for an angle of incidence comprised in the range 0°-20°.

In other embodiments of the invention, the mean reflection factor between 280 nm and 380 nm Ruv of main face of ophthalmic lens invention is lower than 7%, preferably lower than 5%, more preferably lower than 4%, even more preferably lower than 3%, ideally lower than 2% for an angle of incidence comprised in the range 30°-45°.

From a careful analysis, one observes that depending on reflected light color and refractive index of substrate parameters, associations of materials are more valuable.

Figure 5:
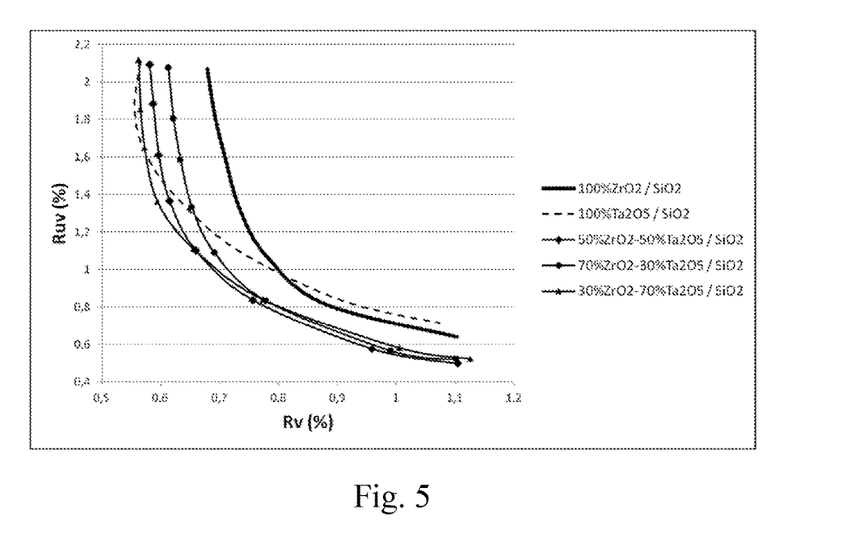
FIG. 5: Rv/Ruv compromise for composite layers of ZrO2/Ta2O5 of various compositions, on substrate of refractive index 1.5 and for a green reflected light.
Figure 6:
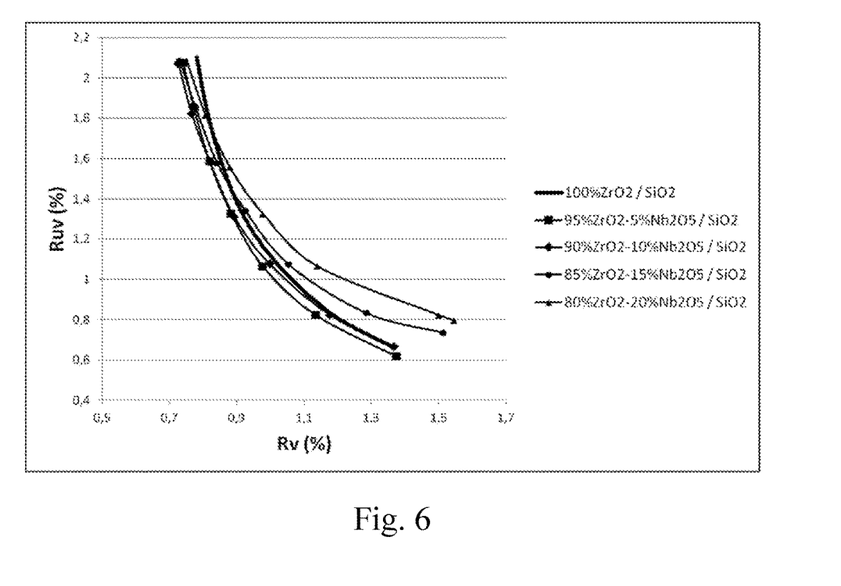
FIG. 6: Rv/Ruv compromise for composite layers of ZrO2/Nb2O5 of various compositions, on substrate of refractive index 1.5 and for a green reflected light.

FIG. 5 shows very interesting results for gold reflection with very low Rv values, below 0.65% for an angle of incidence of 15°, with ZrO2/Ta2O5 composites.

Figure 7:
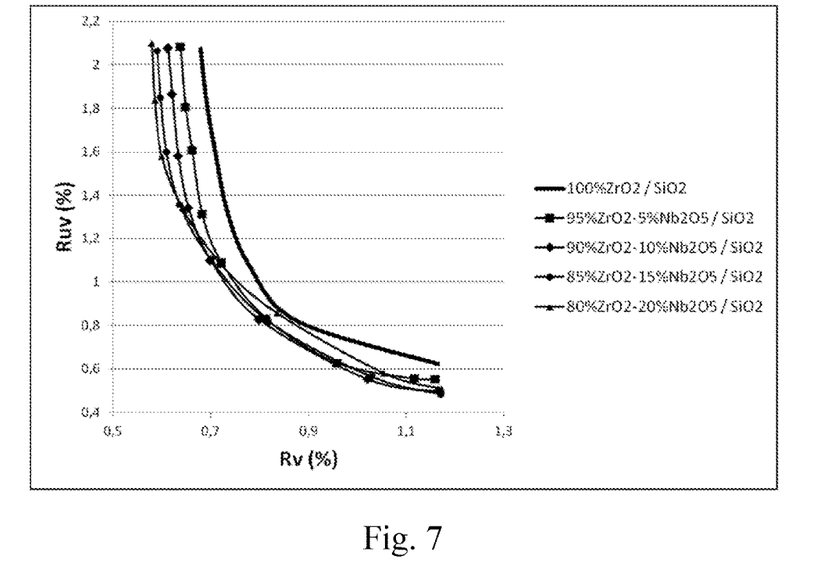
FIG. 7: Rv/Ruv compromise for composite layers of ZrO2/Nb2O5 of various compositions, on substrate of refractive index 1.5 and for a gold reflected light.
Figure 8:
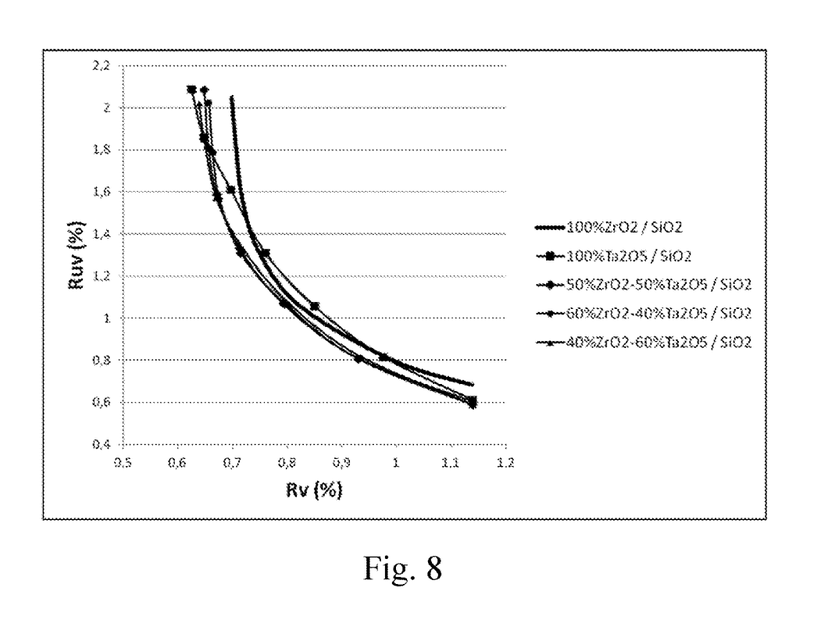
FIG. 8: Rv/Ruv compromise for composite layers of ZrO2/Ta2O5 of various compositions, on substrate of refractive index 1.6 and for a green reflected light.

FIG. 7 shows similar results for gold reflection with very low Rv values, below 0.65% for an angle of incidence of 15°, with ZrO2/Nb2O5 composites.

Figure 9:
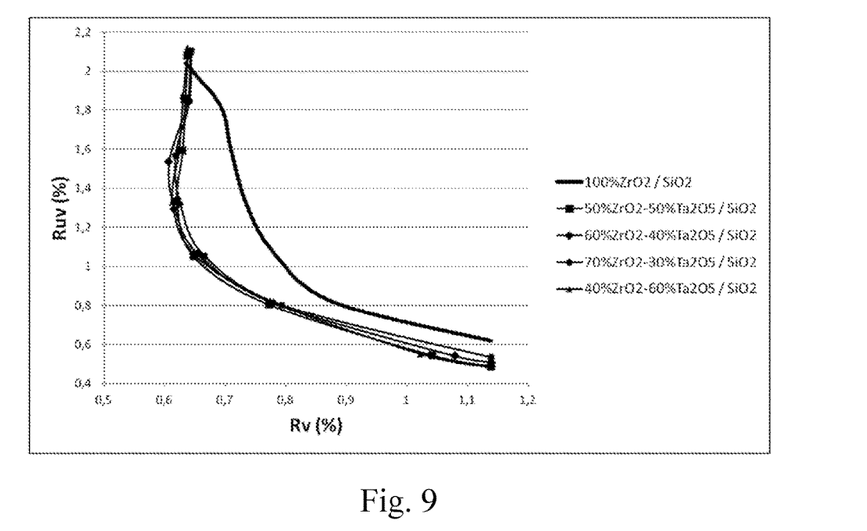
FIG. 9: Rv/Ruv compromise for composite layers of ZrO2/Ta2O5 of various compositions, on substrate of refractive index 1.6 and for a gold reflected light.
Figure 10:
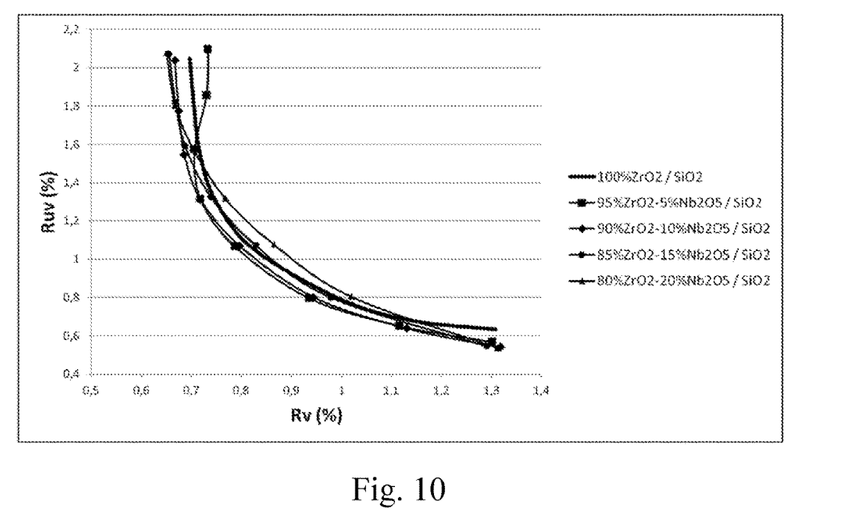
FIG. 10: Rv/Ruv compromise for composite layers of ZrO2/Nb2O5 of various compositions, on substrate of refractive index 1.6 and for a green reflected light.

FIG. 9 shows very interesting results for gold reflections on high index substrates (1.6), with Rv below 0.65% for an angle of incidence of 15° and Ruv below 1.6% for an angle of incidence of 35°, with ZrO2/Ta2O5 composites.

In some embodiments of the invention, the light reflected by main face of ophthalmic lens has a chroma of less than 12 and a hue comprised in the range 30°-60°, for an angle of incidence comprised in the range 0°-20°. More particularly, with gold reflected light, Rv may be lower than 0.65% for an angle of incidence of 15° and Ruv may be lower than 2% for an angle of incidence of 35°, over a wide range of composition.

In other embodiments of the invention, light reflected by main face of ophthalmic lens has a chroma of less than 12 and a hue comprised in the range 120°-150°, for an angle of incidence comprised in the range 0°-20°.

The invention claimed is:

1. An ophthalmic lens, comprising:
a substrate with a main face, said main face being coated with an antireflective stack comprising at least one composite layer comprising zirconium oxide and another metal oxide;
wherein the mean reflection factor Ruv on said main face, between 280 nm and 380 nm is lower than 7%, for an angle of incidence comprised in the range 30°-45°.

2. The ophthalmic lens of claim 1, wherein the composite layer comprises more than 30% of zirconium oxide in weight as compared to the total weight of the composite layer.

3. The ophthalmic lens of claim 1, wherein the composite layer has a refractive index higher than 1.6.

4. The ophthalmic lens of claim 1, wherein the mean light reflection factor Rv on said main face is lower than 1.25%, for an angle of incidence comprised in the range 0°-20°.

5. The ophthalmic lens of claim 1, wherein the mean reflection factor between 280 nm and 380 nm Ruv on said main face is lower than 5%, for an angle of incidence comprised in the range 30°-45°.

6. The ophthalmic lens of claim 1, wherein the mean reflection factor between 280 nm and 380 nm Ruv on said main face is lower than 3%, for an angle of incidence comprised in the range 30°-45°.

7. The ophthalmic lens of claim 1, wherein the mean reflection factor between 280 nm and 380 nm Ruv on said main face is lower than 2%, for an angle of incidence comprised in the range 30°-45°.

8. The ophthalmic lens of claim 1, wherein the reflected light reflected by said main face has a chroma of less than 12 and a hue comprised in the range 120°-150°, for an angle of incidence comprised in the range 0°-20°.

9. The ophthalmic lens of claim 1, characterized in that the reflected light reflected by said main face has a chroma of less than 12 and a hue comprised in the range 30°-60°, for an angle of incidence comprised in the range 0°-20°.

10. A method to prepare an ophthalmic lens of claim 1, wherein zirconium oxide and another metal oxide are simultaneously evaporated in a vacuum deposition step.

11. The ophthalmic lens of claim 1, wherein the antireflective stack comprises at least two composite layers comprising zirconium oxide and another metal oxide.

12. The ophthalmic lens of claim 11, wherein the composite layers comprise zirconium oxide and less than 23% of niobium oxide in weight as compared to the total weight of the composite layer.

13. The ophthalmic lens of claim 11, wherein the composite layers comprise zirconium oxide and tantalum oxide.

14. The ophthalmic lens of claim 13, wherein the composite layers comprise zirconium oxide and less than 70% of tantalum oxide in weight as compared to the total weight of the composite layer.

* * * * *